(12) United States Patent
Hosono et al.

(10) Patent No.: US 7,184,314 B2
(45) Date of Patent: Feb. 27, 2007

(54) SEMICONDUCTOR MEMORY DEVICE

(75) Inventors: Koji Hosono, Yokohama (JP); Koichi Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 80 days.

(21) Appl. No.: 11/145,940

(22) Filed: Jun. 7, 2005

(65) Prior Publication Data

US 2005/0276109 A1   Dec. 15, 2005

(30) Foreign Application Priority Data

Jun. 9, 2004   (JP)   ............................. 2004-171583

(51) Int. Cl.
   *G11C 11/34* (2006.01)
(52) U.S. Cl. .................. 365/185.25; 365/148
(58) Field of Classification Search ........... 365/185.25, 365/148
   See application file for complete search history.

(56) References Cited

U.S. PATENT DOCUMENTS

| 4,935,901 | A | * | 6/1990 | Sasaki et al. | .......... 365/230.03 |
|---|---|---|---|---|---|
| 6,717,851 | B2 | * | 4/2004 | Mangan et al. | ........ 365/185.11 |
| 6,807,099 | B2 | | 10/2004 | Hosono et al. | |
| 2006/0023507 | A1 | * | 2/2006 | Mangan et al. | ........ 365/185.05 |
| 2006/0067138 | A1 | * | 3/2006 | Ogiwara et al. | ....... 365/189.09 |

FOREIGN PATENT DOCUMENTS

JP   2002-74997   3/2002

* cited by examiner

*Primary Examiner*—M. Tran
(74) *Attorney, Agent, or Firm*—Oblon, Spivak, McClelland, Maier & Neustadt, P.C.

(57) ABSTRACT

A semiconductor memory device comprises a driver including a first resistor, and a control signal generator including a second resistor. A storage unit is employed to store adjustment data for setting a resistance of said second resistor at a designed resistance, which is specified based on the state of the control signal actually obtained when the resistance of the second resistor is set to a certain designed value. The storage unit is referred to for stored data to switch the second resistor to control the state of the control signal. In addition, the first resistor is switched to a resistance corresponding to the resistance of the second resistor.

20 Claims, 11 Drawing Sheets

| D2 | D1 | D0 | PERIOD | OUTPUT SIGNAL |
|----|----|----|--------|---------------|
| 0  | 0  | 0  | 0.7 × Tclk | SW0 |
| 0  | 0  | 1  | 0.8 × Tclk | SW1 |
| 0  | 1  | 0  | 0.9 × Tclk | SW2 |
| 0  | 1  | 1  | Tclk       | SW3 |
| 1  | 0  | 0  | 1.1 × Tclk | SW4 |
| 1  | 0  | 1  | 1.2 × Tclk | SW5 |
| 1  | 1  | 0  | 1.3 × Tclk | SW6 |
| 1  | 1  | 1  | 1.4 × Tclk | SW7 |

(Rerated Art)

FIG. 15 (Rerated Art)

FIG. 16

SEMICONDUCTOR MEMORY DEVICE

CROSS-REFERENCE TO PRIOR APPLICATION

This application is based upon and claims the benefit of priority from the prior Japanese Patent Application No. 2004-171583, filed on Jun. 9, 2004, the entire content of which is incorporated herein by reference.

BACKGROUND OF THE INVENTION

1. Field of the Invention

The present invention relates to a semiconductor memory device, and more particularly to adjustment of control signals (such as a clock signal) that define core operations of semiconductor memory elements.

2. Description of the Related Art

An electrically erasable programmable EEPROM, such as a NAND cell-type EEPROM that configures a NAND cell with a plurality of serially connected memory cells, has been known as one of semiconductor memory devices. A memory cell in the NAND cell-type EEPROM has a FETMOS structure with a charge storage layer (floating gate) and a control gate stacked on a semiconductor substrate. The memory cell stores data "0" or "1" depending on the amount of charge accumulated in the floating gate. On data reading, programming (writing) and erasing in the memory cell, such the NAND cell-type EEPROM requires application of voltages to bit lines, word lines and the substrate (or well) with various magnitudes at determined timings depending on situations (see JP-A 2003-208793, pages 4–6, FIG. 4, for example).

SUMMARY OF THE INVENTION

The present invention provides a semiconductor memory device, which comprises a memory cell array including a plurality of data-storing memory cells arranged in matrix at intersections of word lines and bit lines; a decoder operative to select a memory cell in the memory cell array; and a driver configured to charge the word line or bit line and including a first resistor. The first resistor has a resistance variable to change a rate of charging the word line or bit line. The semiconductor memory device also comprises a voltage generator operative to generate a voltage supplied to the driver; a sequence controller operative to control operations of the voltage generator and the driver in accordance with a procedure instructed by a command and along an operation timing indicated by a control signal; and a control signal generator configured to generate the control signal and including a second resistor. The second resistor has a resistance variable to change the state of the control signal. The semiconductor memory device further comprises a storage unit operative to store a adjustment data for setting a resistance of said second resistor at a designed resistance A control unit is operative to refer to the storage unit for stored data and switch the second resistor to control the state of the control signal, and operative to switch the first resistor to a resistance corresponding to the resistance of the second resistor.

DETAILED DESCRIPTION OF THE PREFERRED EMBODIMENTS

The embodiments of the present invention will now be described with reference to the drawings. An related art will be described first.

Figure 14:
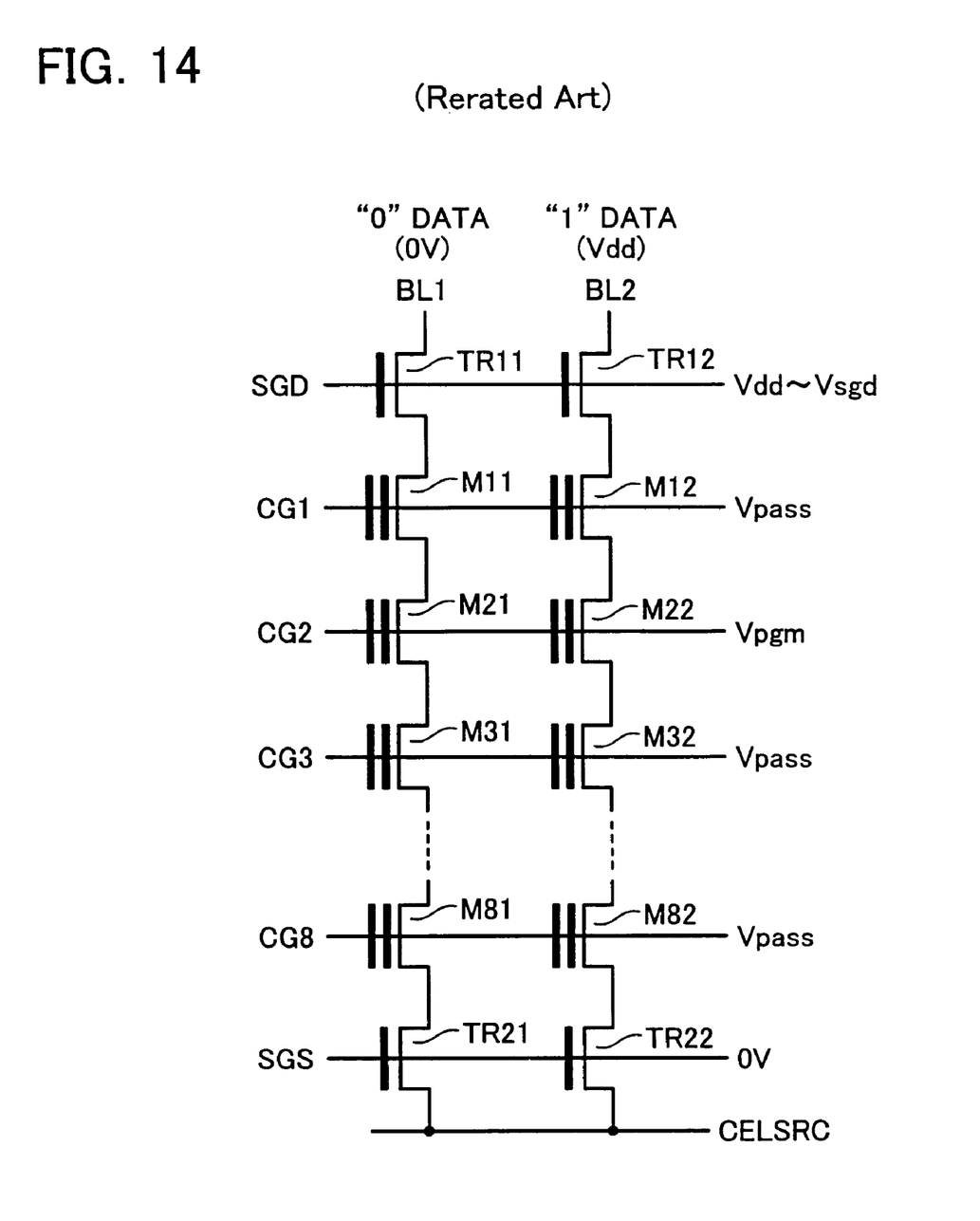
FIG. 14 shows two adjacent NAND-type cells in a NAND cell-type EEPROM in the art.

FIG. 14 shows two adjacent NAND-type cells of a related art. Serially connected eight memory cells M11–M81 (M12–M82) have one end connected via a selection transistor TR11 (TR12) to a bit line BL1 (BL2) and the other end connected via another selection transistor TR21 (TR22) to a common source line CELSRC. The memory cells in the NAND-type cells have respective control gates, which are laterally arranged to form control gate lines CG1, CG2, . . . CG8, or word lines. The selection transistors TR11 (TR12) and TR21 (TR22) have respective gate electrodes, which are laterally connected to form selection gate lines SGD and SGS.

Data programming in such NAND-type cells is performed as follows. A programming voltage Vpgm boosted to about 20 V is applied to a selected word line (control gate line), and an intermediate voltage Vpass of about 10 V to non-selected word lines. The channel voltage at a selected memory cell is controlled in accordance with data "0" or "1". In the case shown in FIG. 14, data "0" and "1" are given to the bit lines BL1 and BL2, respectively. The programming voltage Vpgm is applied to the control gate line CG2, and the intermediate voltage Vpass to other non-selected control gate lines CG1, CG3–CG8 to "0" program in the memory cell M21.

The bit line BL1 for "0" data programming is kept at 0 V to transfer the bit line voltage to the channel in the selected memory cell. Thus, electrons are injected by tunnel current into the floating gate in the selected memory cell M21 to shift the threshold thereof to the positive state, which corresponds to the "0" data-programmed state. A voltage of Vdd is applied to the bit line BL2 for "1" data programming, while Vdd is applied to the selection gate line SGD, to turn off the selection transistor TR12. Accordingly, the channels in the memory cells arrayed along the "1" data-given bit line are floated. As a result, capacitive coupling with the control gate boosts the potential on the channel up to about 5–8 V. Therefore, even the memory cell M22 arrayed along the control gate line CG2 given the programming voltage Vpgm can be shifted to the negative state or "1" data-programmed without any fluctuation in threshold.

Figure 15:
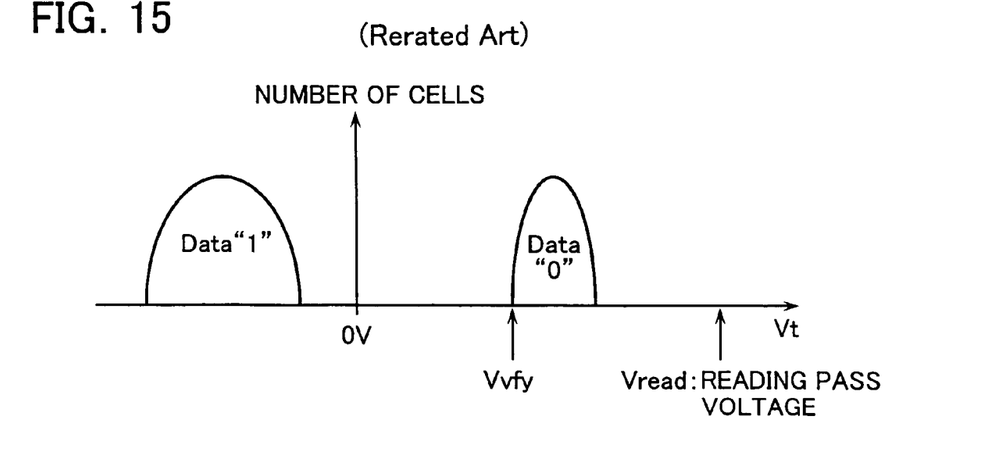
FIG. 15 shows variations in threshold between data "0"- and "1"-programmed memory cells.

The cells may have variations in both negative and positive thresholds as shown in FIG. 15. In consideration of such the variations and data retaining properties, a reading pass voltage Vread and a verify voltage Vvfy are determined.

Data erasing in the NAND-type cells is performed as follows. In general, a voltage of 0 V is applied to all word lines in the selected NAND-type cell, and an erasing voltage of about 20 V is applied to the substrate or well to release the charge from inside the floating gate to the substrate. Thus, all memory cells in the selected NAND-type cell are erased into the state of data "1" with the negative threshold. In the NAND-type EEPROM, a set of the memory cells thus erased simultaneously, or a set of the NAND-type cells that share the word lines and the selection gate lines, is referred to as a block. In non-selected blocks that are not the target to be erased, floating the word lines can prevent data erasing in the memory cells even if the well is commonly used with the selected block.

Data reading is performed by applying 0 V to the selected word line and the voltage Vread to the remaining word lines, and detecting through the bit lines BL1, BL2 whether the NAND-type cell turns on. The voltage Vread is such a voltage that can turn on a memory cell regardless of data "0" or "1".

Figure 16:
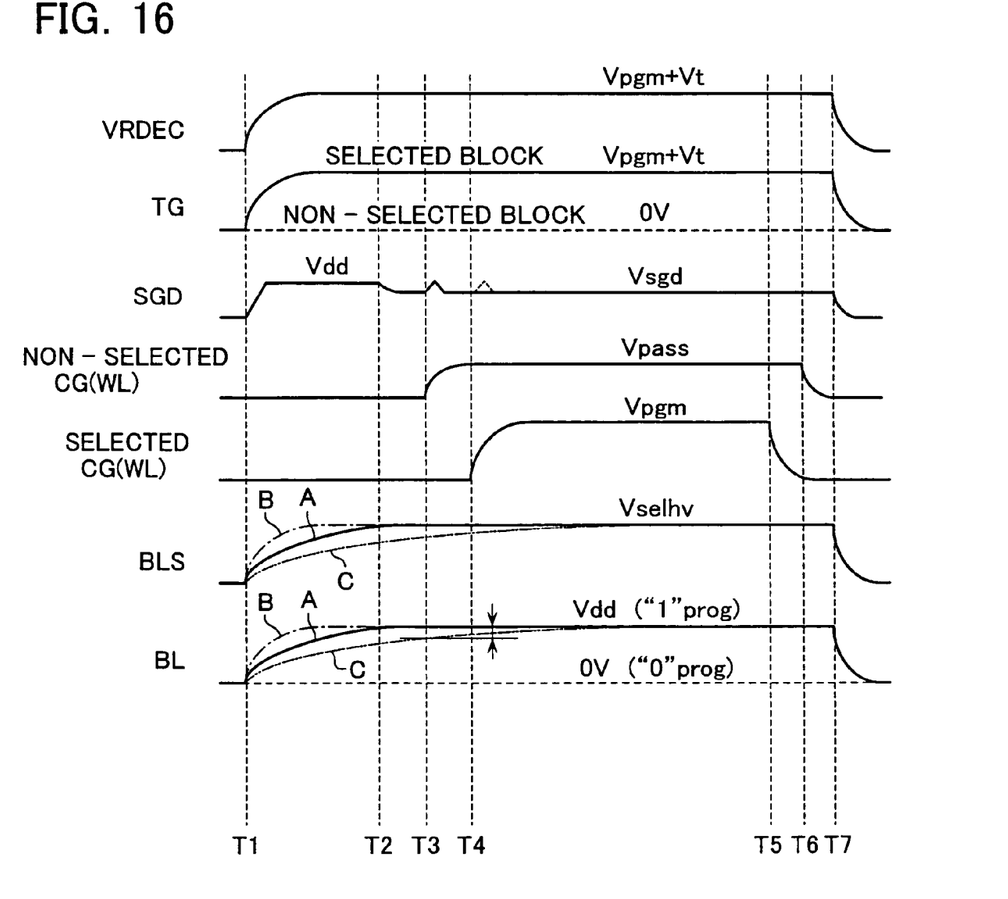
FIG. 16 is a timing chart showing an operation of the NAND cell-type EEPROM in the art.

FIG. 16 shows signal waveforms at various portions on programming in the NAND-type EEPROM. A selection signal VRDEC is provided from a VRDEC decoder, not shown, to a row decoder (not shown in FIG. 14) in the selected block of memory cells. The selection signal VRDEC starts rising at time T1 and gradually elevates up to a voltage of Vpgm+Vt (where Vt is the threshold voltage). This voltage is applied to a gate TG of a transfer transistor in the selected row decoder to allow the transfer transistor in the selected row decoder to transfer the programming voltage Vpgm to the selected word line. A voltage of 0 [V] is applied to gates of transfer transistors in non-selected row decoders.

A selection gate signal SGD as shown in FIG. 16 is applied to the gates of the selection transistors TR11 and TR12 in the selected memory cell array. A voltage of 0 [V] is applied to gates of the selection transistors TR21 and TR22 on the other side of the NAND cell unit though it is not depicted.

After the selection gate signal SGD is applied and when the channel in the selected NAND cell unit is charged up to Vdd−Vt or Vsgd−Vt, the selection transistor TR12 is cut off.

A bit line driver, not shown, provides a bit line selection signal BLS, which starts rising at time T1, then gradually elevates from 0 [V] and reaches Vselhv at time T2. Thus, a bit line voltage BL gradually elevating from 0 [V] to Vdd [V], spending time from T1 to T2 as shown in FIG. 16, is applied to the bit line BL2.

The bit line selection signal BLS and the bit line voltage BL are controlled to have slowly sloped rising waveforms (for example, the curves A shown in FIG. 16) to reduce a peak value of power consumption on charging the bit line. For the purpose, a resistor is inserted in the bit line driver to cause a CR delay to achieve slow rising, which is effective to reduce a peak current.

When the bit line voltage BL on the bit line BL2 rises up to Vdd, the voltages on non-selected control gate lines (other than CG2 in FIG. 14) are gradually elevated to Vpass, spending time from T3 to T4. In addition, the voltage on the selected control gate line (CG2 in FIG. 14) is gradually elevated up to Vpgm after time T4. Thus, the selected memory cell M21 associated with the 0V-applied bit line is programmed so as to shift the threshold to the positive state. On the other hand, the memory cell M22 associated with the Vdd-applied bit line is "1" data-programmed without any fluctuation in threshold.

The operations of the NAND cell-type EEPROM, including such the programming, are defined by operation timing signals created at a timer (not shown in FIG. 14) based on a clock signal generated from a clock generator (not shown in FIG. 14). The clock generator of this type generally comprises a RC oscillator including a resistor and a capacitor, and the resistance of the resistor is employed to determine a period of the generated clock signal. Such the resistance in the clock generator may often not have a desired value as designed due to process variations, for example. Therefore, trimming is required in such the clock generator after production to achieve a desired clock signal period.

Similarly, in the bit line driver and the word line driver, the resistance of the resistor contained inside is also given an appropriate designed value to achieve an appropriate rising waveform of the bit line voltage as well as the word line voltage.

In such the bit line driver, however, the resistance of the resistor contained inside may differ from the designed value due to the process variation, for example. This difference may possibly cause a malfunction as described below. When the voltage on the word line elevates to Vpass or Vpgm (during time T3–T4 or after T4 in FIG. 16), a coupling noise in the cell array may possibly cause a temporary boost on the selection gate signal SGD (see the waveform in FIG. 16). In this case, in the NAND cell unit to be "1" programmed, the potential on the selection gate signal SGD and the bit line potential are required to have a relation that does not lower the channel potential in the NAND cell unit. If the bit line is not charged to a certain potential relative to the temporarily boosted SGD potential, the selection transistor has a large cut-off current, which prevents the channel potential in the NAND cell unit from sufficiently elevating and easily results in erroneous programming.

Thus, it is required to adjust the rate of rising (charging) the bit line selection signal BLS as well as the bit line voltage BL so as to have an appropriate magnitude that can reduce a peak current and prevent an occurrence of erroneous programming. Accordingly, it is extremely important to select an appropriate increasing curve for the bit line selection signal BLS as well as the bit line voltage BL.

If the resistance inside the bit line driver varies to a smaller one, the bit line voltage BL exhibits a sharp rising curve B rather than an ideal bit line voltage curve A in FIG. 16. The voltage curve with sharper rising (larger sloping)

than the ideal curve cause a larger peak current, which imposes a heavy load on the power source in the system.

In contrast, if the resistance varies to a larger one, the bit line voltage BL changes along a curve C with a smaller slope than the ideal curve A. In this case, the leakage of the channel current may cause erroneous programming possibly.

Also in the word line driver, when the resistance of an internal resistor varies from a designed value, an increasing curve of the word line voltage may differ from an ideal one. This difference may cause a similar malfunction possibly though the detailed description is omitted.

Figure 1:
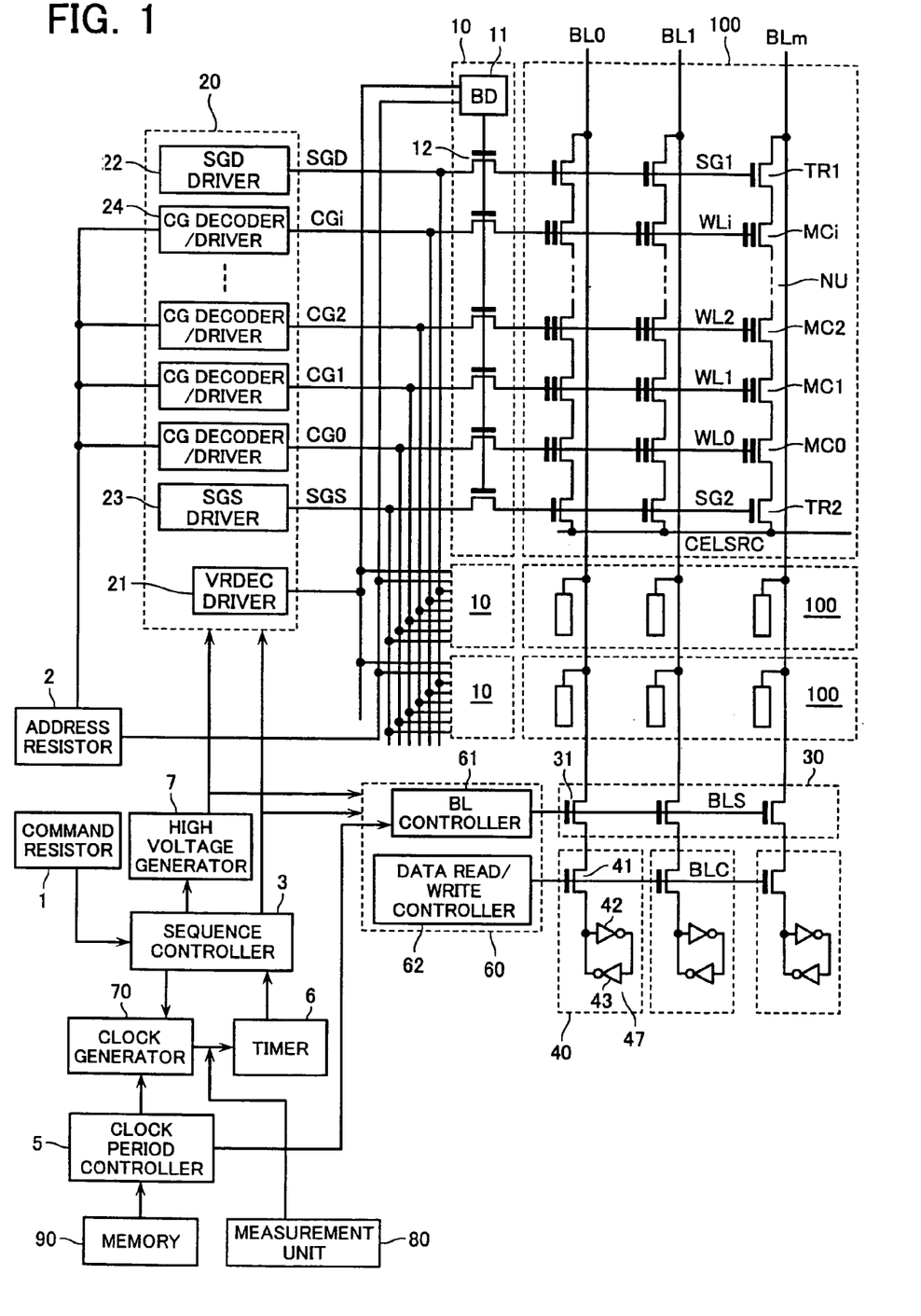
FIG. 1 is a block diagram showing a configuration of a NAND cell-type EEPROM according to one embodiment of the present invention.

FIG. 1 is a block diagram showing a configuration of a NAND cell-type EEPROM according to one embodiment of the present invention. This NAND cell-type EEPROM comprises a memory cell array including a plurality of memory cell blocks 100; a transfer transistor array 10 including a block decoder; a row signal driver 20 including CG decoders; a bit line selection transistor circuit 30; a sense amp and data latch 40; and a sense amp controller 60.

Each memory cell block 100 includes arrayed NAND cell units NU each having a plurality of floating-gate memory cells MC0–MCi. Specifically, the NAND cell unit NU has a cell string of serially connected memory cells MC0–MCi, a selection gate transistor TR1 located between a drain of the cell at one end of the string and a bit line BLi, and a selection gate transistor TR2 located between a source of the cell at the other end and a source line CELSRC.

The memory cells MC0–MCi have respective control gates connected to word lines WL0–WLi, and the selection gate transistors TR1 and TR2 have respective gates connected to selection gate lines SG1 and SG2 extending in parallel with the word lines WL0–WLi. A set of memory cells arranged along one word line configures one page.

The transfer transistor array 10 includes transfer transistors 12 connected to the word lines WL1–WLi and the selection gate lines SG1 and SG2, respectively. The transfer transistors 12 are employed to transfer various voltages to the word lines WL0–WLi and the selection gate lines SG1 and SG2 from the row signal driver 20 including CG decoders. The transfer transistor 12 is configured to turn on and begin operation on receipt of a gate signal input from the block decoder 11.

The row signal driver 20 including CG decoders comprises a VRDEC driver 21, a SGD driver 22, a SGS driver 23, and CG decoders/drivers 24. The VRDEC driver 21 supplies a signal VRDEC for driving the transfer transistor array 10 corresponding to the selected memory cell block 100.

The SGD driver 22 supplies a drive signal SGD to the gate of the selection gate transistor TR1 in the selected memory cell block 100. Similarly, the SGS driver 23 supplies a drive signal SGS to the gate of the selection gate transistor TR2 in the selected memory cell block 100. The CG decoder/driver 24 applies voltages such as the programming voltage Vpgm and the intermediate voltage Vpass to the word lines WL0–WLi in the selected memory cell block 100. An address resistor 2 provides the CG decoder/driver 24 with address information corresponding to the word lines WL0–WLi in the NAND cell unit. The address resistor 2 provides the block decoder 11 with block address information.

The bit line selection transistor circuit 30 has a plurality of bit line selection transistors 31. The bit line selection transistors 31 are turned on in accordance with a signal from the sense amp controller 60 to apply a bit line voltage BL to the bit line BLi based on write data held in the sense amp and data latch 40.

The sense amp and data latch 40 includes a clamping transistor 41, and a latch circuit 47 composed of inverters 42 and 43, and has a function of storing and holding read data and write data.

The sense amp controller 60 includes a bit line controller 61 and a data read/write controller 62. The bit line controller 61 controls a bit line selection signal BLS supplied to the gate of the bit line selection transistor 31 to control the magnitude of the bit line voltage BL applied to the bit line BLi. The data read/write controller 62 controls data reading from and data writing to the sense amp and data latch 40.

The NAND cell-type EEPROM comprises a sequence controller 3 for controlling operation timings of the row signal driver 20 including CG decoders and the sense amp controller 60. The sequence controller 3 performs the control in accordance with a command given from a command resistor 1 and along a timing signal provided from a timer 6. The timer 6 provides the timing signal in accordance with a clock signal output from a clock generator 70. The period of the clock signal is controllable with a control signal from a clock period controller 5.

Figure 2:
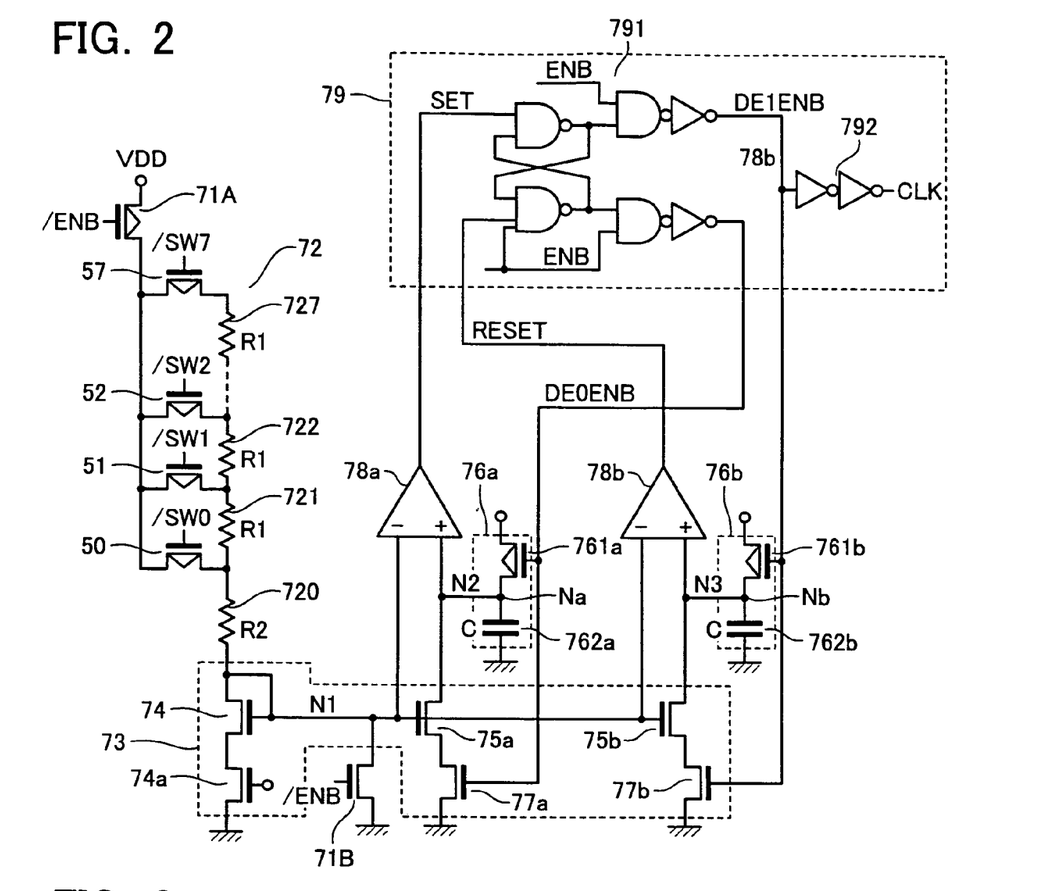
FIG. 2 shows a specific configuration of a clock generator 70.

A specific configuration of the clock generator 70 is shown in FIG. 2.

The clock generator 70 includes a switching PMOS transistor 71A, a switching NMOS transistor 71B, a variable resistor circuit 72, a current mirror circuit 73, charging/discharging circuits 76a and 76b, differential amplifiers 78a and 78B, and an output circuit 79.

An inverted signal /ENB of an enable signal ENB is given to the gate terminals of the switching transistors 71A and 71B at the beginning of operation of the clock generator 70. As a result, the transistor 71A turns on and the transistor 71B off to begin the operation of the clock generator 70. In order to vary the period of the clock signal output from the output circuit 79, the variable resistor circuit 72 changes the magnitude of the resistance connected between the supply voltage VDD and the current mirror circuit 73. The variable resistor circuit 72 includes eight resistors 720–728 and eight switching transistors 50–57. The resistors 720–728 are connected in serial. The resistor 720 only has a resistance R2 and others a resistance R1.

The switching transistors 50–57 are connected in parallel between respective one of nodes on the positive (+) side of the resistors 720–727 and a drain terminal of the switching transistor 71A. In these switching transistors 50–57, only one is turned on by output signals /SW0–/SW7 while remaining the others off.

The current mirror circuit 73 includes NMOS transistors 74, 74a, 75a, 75b, 77a and 77b as connected in the following manner. The NMOS transistor 74 is diode-connected. It has a drain terminal connected to the variable resistor circuit 72 and a source terminal connected to the NMOS transistor 74a for resistance matching. The NMOS transistor 74a has a source terminal grounded. The NMOS transistor 74 has a gate terminal commonly connected to gate terminals of the NMOS transistors 75a and 75b as well as the inverting (minus) input terminals of the differential amplifiers 78a and 78b.

The NMOS transistor 75a has a drain terminal connected to the non-inverting (plus) input terminal of the differential amplifier 78a and a source terminal connected to a drain terminal of a NMOS transistor 77a. The NMOS transistor 77a has a source terminal grounded and a gate terminal that receives an output signal DE0ENB from the output circuit 79.

The NMOS transistor 75b has a drain terminal connected to the non-inverting input terminal of the differential amplifier 78*b* and a source terminal connected to a drain terminal of a NMOS transistor 77*b*. The NMOS transistor 77*b* has a source terminal grounded and a gate terminal that receives an output signal DE1ENB from the output circuit 79. The transistors 75*a* and 77*a* have a W/L ratio equal to that of the transistor 74. Therefore, these transistors allow the current of the same magnitude to flow therein.

The charging/discharging circuit 76*a* includes a PMOS transistor 761*a* and a capacitor 762*a*, which are serially connected between the supply voltage VDD and the ground terminal and have a connection node Na connected to the non-inverting input terminal of the differential amplifier 78*a*. The capacitor 762*a* is charged up to the supply voltage VDD when the PMOS transistor 761*a* turns on while it is discharged when the PMOS transistor 761*a* turns off.

Similarly, the charging/discharging circuit 76*b* includes a PMOS transistor 761*b* and a capacitor 762*b*, which are serially connected between the supply voltage VDD and the ground terminal and have a connection node Nb connected to the non-inverting input terminal of the differential amplifier 78*b*. The capacitor 762*b* is charged up to the supply voltage VDD when the PMOS transistor 761*b* turns on while it is discharged when the PMOS transistor 761*b* turns off.

The differential amplifier 78*a*, 78*b* compares the input signal to the non-inverting input terminal with that to the inverting input terminal. It makes the output signal (SET from 78*a* and RESET from 78*b*) "H" if the former is equal to or higher than the latter and "L" if the former is lower than the latter to the contrary.

The output circuit 79 includes a logic circuit 791 containing a flip-flop circuit, and an inverter circuit 792. The logic circuit 791 begins operation when the enable signal ENB is made "H". It provides the output signal DE0ENB or DE1ENB that is alternately changed between "H" and "L" every time the output signals SET and RESET from the differential amplifiers 78*a* and 78*b* are alternately switched from "H" to "L". The inverter circuit 792 provides a clock signal CLK generated through a certain number of inversions of the output signal DE0ENB.

Figure 3:
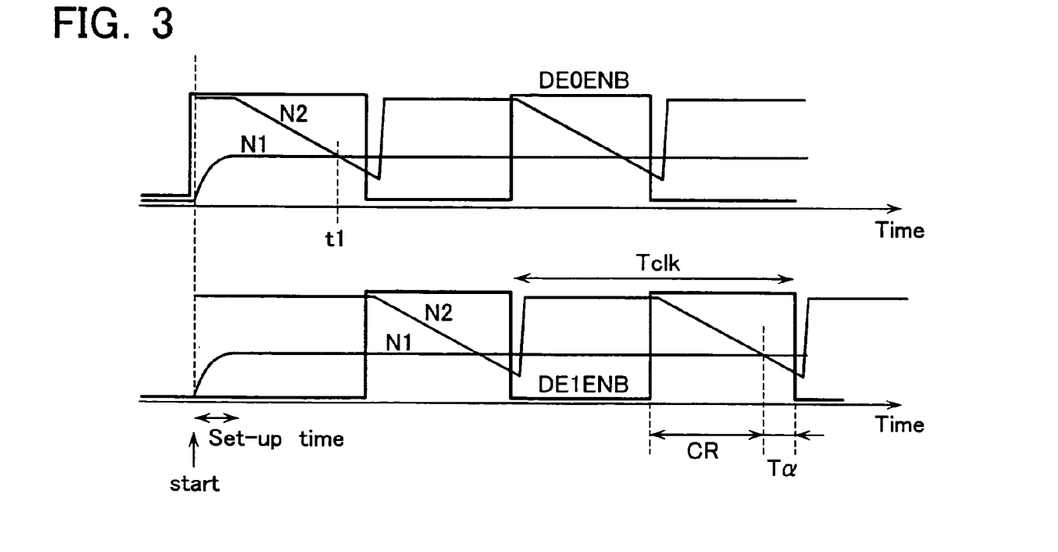
FIG. 3 is a timing chart showing an operation of the clock generator 70.

An operation of the clock generator is described with reference to a timing chart of FIG. 3 on the assumption that only the output signal /SW3 is made "L" to turn on the switching transistor 53.

In the initial state, the enable signal ENB is kept "L" and the output signals DE0ENB and DE1ENB both "L", which make the output signals SET and RESET from the differential amplifiers 78*a* and 78*b* both "H".

When the enable signal ENB changes from "L" to "H" (the inverted signal /ENB changes to "L"), the transistor 71A turns on and the transistor 71B off. In addition, the output signal DE0ENB is made "H", which turns the transistor 77*a* on and the PMOS transistor off in the charging/discharging circuit 76*a*.

At the same time, the transistor 53 of the switching transistors 50–57 turns on. Thus, the variable resistor circuit 72 provide a resistance of R=3×R1+R2. If a voltage of Vn1 is applied to the gate (node N1) of the transistors 74, 75*a* and 75*b*, the current flowing in the transistor 75*a* in the current mirror circuit 73 has a magnitude of (Vdd−Vn1)/R.

This current acts to release the charge from inside the capacitor 762*a* in the charging/discharging circuit 76*a*. Preferably, the transistors 74, 75*a* and 75*b* have such a gate length L that sufficiently reduces the effect of channel length modulation and achieves stable constant current discharging.

When the potential on the node N2 at the positive (+) side of the capacitor becomes lower than the potential on the node N1 at time t1 as discharging proceeds, the output signal SET from the differential amplifier 78*a* makes a "H" to "L" transient. When a certain delay time Tα elapses after the transient, the output signal DE0ENB changes from "H" to "L" and the output signal DE1ENB from "L" to "H" instead. These changes turn the transistor 77*b* on and the transistor 77*a* off. Thus, the charging/discharging circuit 76*a* halts discharging and begins charging while the charging/discharging circuit 76*b* halts charging and begins discharging. Thereafter, the differential amplifier 78*b* operates similarly as described for 77*a* to switch the output signal DE1ENB from "H" to "L" and the output signal DE0ENB from "L" to "H" instead. As the above operation is repeated, the output signal from the inverter circuit 792, or the clock signal CLK, appears as a periodic signal that alternates "H" and "L".

When a time C×R elapses (C denotes a capacitance of the capacitor 762*a*, 762*b*, and R a resistance provided by the variable resistor circuit 72) after the output signal DE0ENB (DE1ENB) rises, the potential on the node N2 (N3) becomes lower than the potential on the node N1. Subsequently, the output signal DE0ENB (DE1ENB) falls again from "H" to "L" after a time Tα elapses. The larger the resistance R provided by the variable resistor circuit 72, the longer the time CR, and accordingly the larger the period of the clock signal CLK, (2×(CR+Tα)), becomes.

Figure 4:
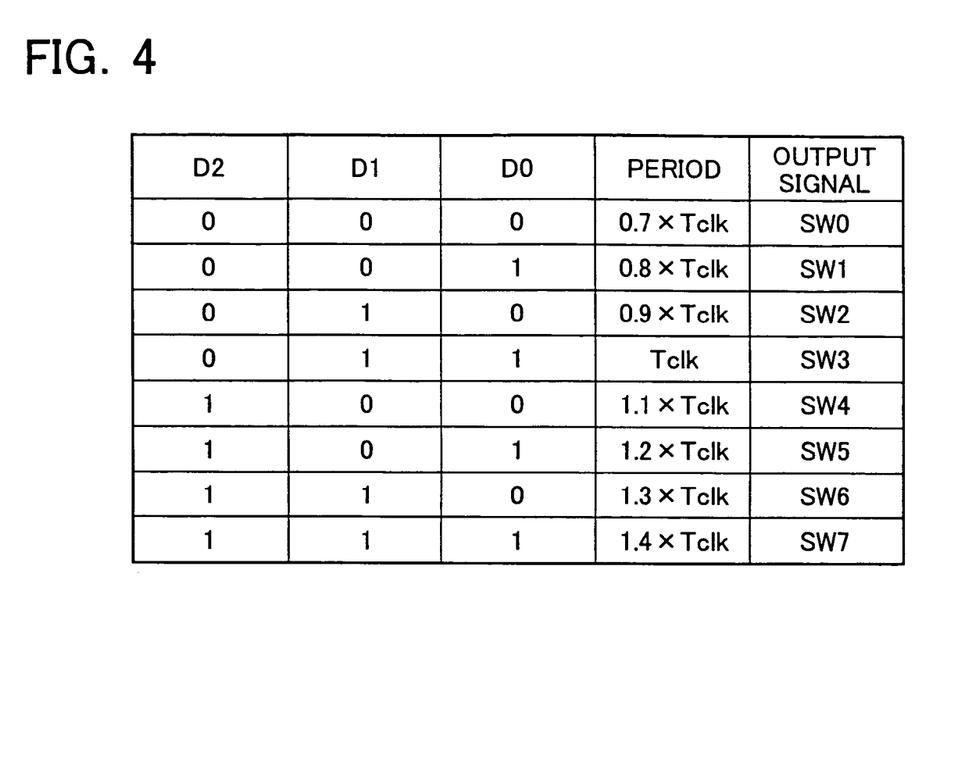
FIG. 4 shows relations among binary selection signals D0–D2 output from a clock period controller 5, output signals SWi to be set "H", and resistances provided from a variable resistor circuit 72.

Thus, it is possible to vary the period of the clock signal CLK by changing the resistance R provided from the variable resistor circuit 72. Specifically, as shown in FIG. 4, the clock period controller 5 provides the binary selection signals D0–D2 to change one of the output signals SW0–SW7 to "H". In this way, the period of the clock signal CLK can be varied in 8 stages at an interval of 0.1×tclk between 0.7×Tclk and 1.4×Tclk.

Figure 5:
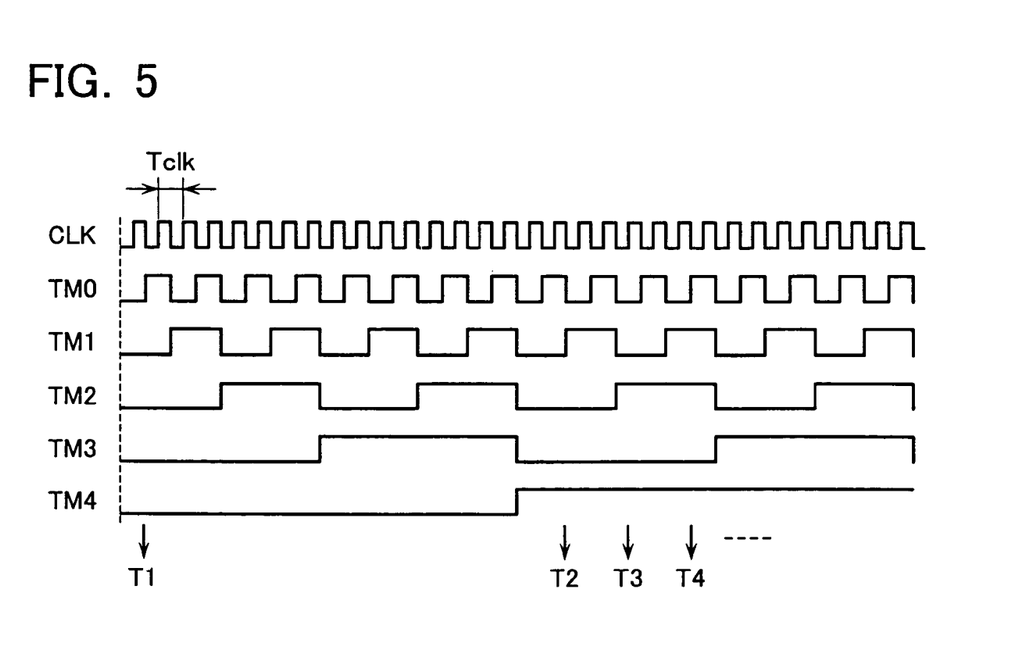
FIG. 5 shows a relation among a clock signal CLK, timing signals TM0–TM4, and operation timings.

The timer 6 generates signals TM1–TM4 having integer-multiplied periods compared to the period of the clock signal CLK. A logical operation, such as a logical sum, of these signals CLK, TM1–TM4 can determine the operation timings (T1–T4 shown in FIG. 5) in the sequence controller 3.

If the resistances R1 and R2 differ from the resistance expected at the time of designing due to process variations, however, the period of the clock signal CLK may also differ from the length expected at the time of designing. For example, if the resistance R1 has a 10% error, the period of the clock signal CLK may also have a 10% error similarly. As a result, even if the output signal SW3 is made "H" to achieve the period Tclk, such a desired period can not be obtained.

In this embodiment, a measurement unit 80 (FIG. 1) measures a period Ta that is actually obtained when a certain designed resistance R is provided. This measured period Ta is stored as adjustment data of the designed resistance R in a memory 90. Preferably, the memory 90 comprises a non-volatile semiconductor memory device, such as a laser fuse-type or EEPROM.

The clock period controller 5 refers to the stored data to control the period of the clock signal CLK. For example, if the resistors 720–727 in the variable resistor circuit 72 have actual resistances 10% larger than the designed values, the period of the clock signal CLK is made 10% larger than the value expected at the time of designing even though the output signal SW3 is provided. Then, in order to achieve the period Tclk of the clock signal CLK, the clock period controller 5 provides the output signal SW2 instead of SW3. As a result, the variable resistor circuit 72 provides the resistance of 0.9×R3. Thus, the period of the clock signal CLK can be adjusted after the process steps.

Methods of measuring the period of the clock signal CLK at the measurement unit 80 are described next.

In one method, an operation is executed for an operation time proportional to a clock period to measure the operation time and adjust the clock period so as to provide a desired operation time as designed. For example, when measurement of a busy time in reading provides a desired time as designed, a designed resistance R selected by the selection signals (D0–D2) from the clock controller 5 is stored in the memory 90.

Figure 6:
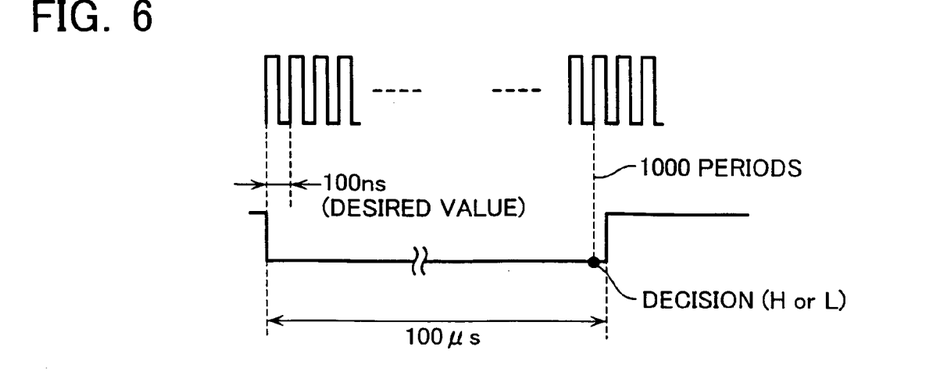
FIG. 6 illustrates a method of measuring a period of the clock signal CLK at a measurement unit 80.

Another method of measuring the period of the clock signal CLK at the measurement unit 80 is described. If a desired period of the clock signal CLK is equal to 100 ns, such a reference signal is given to the measurement unit 80 that remains "L" only for a time period of 100 μm corresponding to a time of 1000 periods as shown in FIG. 6. First, the measurement unit 80 adjusts the setting of the period of the clock signal CLK to the minimum (0.7×Tclk in the example of FIG. 3 with the switch SW0 turned on). When a trigger signal is given, the measurement unit 80 takes in the reference signal and controls the clock generator 70 to provide the clock signal CLK only for 1000 periods. If the reference signal remains "L" after a lapse of 1000 periods, it is meant that the period of the clock signal CLK is shorter than the desired period. In this case, the measurement unit 80 once increments the clock period setting in the clock period controller 5 to provide a clock signal CLK with a one-step larger period than the minimum (a period of 0.8×Tclk in the example of FIG. 3 with the switch SW1 turned on instead of SW0). In this way, if the reference signal changes to "H" when the clock signal CLK reaches 1000 periods, it is meant that the period of the clock signal CLK becomes longer than the desired period. Then, the setting at that time is stored in the memory 90.

Figure 7:
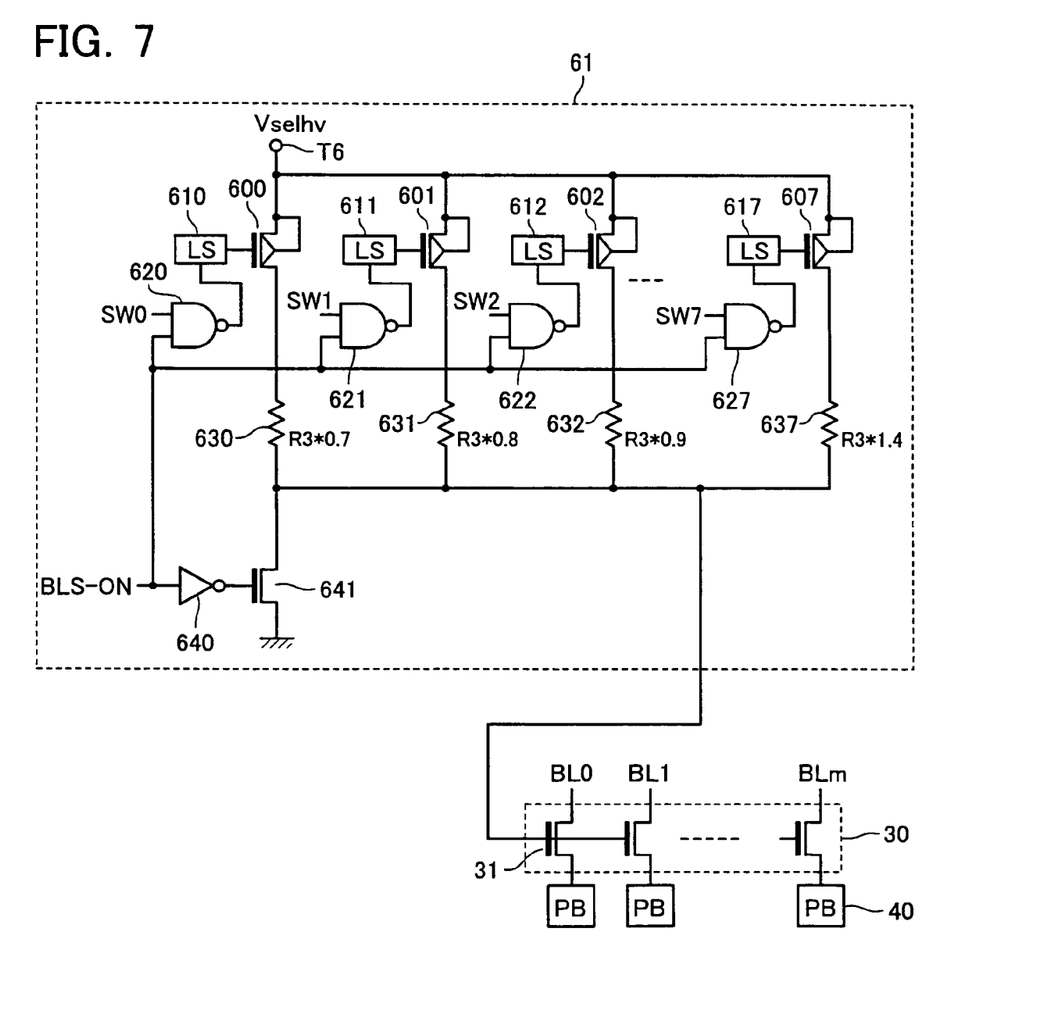
FIG. 7 exemplifies a specific circuit configuration of a bit line controller 61.

FIG. 7 exemplifies a specific circuit configuration of the bit line controller 61. This circuit includes resistors 630–637, which have the same device structures as those of the resistors 720–727 used in the clock generator 70 of FIG. 2. The resistors 630–637 have different resistances in increments of 0.1, such as 0.7×R3, 0.8×R3, ..., 1.4×R3. Between the gate of the bit line selection transistor 31 in the bit line selection transistor circuit 30 and a terminal T6 to which the voltage Vselhv is applied, PMOS transistors 600–607 are connected in serial respectively with the resistors 630–637 to form eight current paths. The PMOS transistors 600–607 have respective gates, which are connected via level shifters 610–617 to the output terminals of NAND circuits 620–627.

Input to the terminals of one input at the NAND circuits 620–627 are the output signals SW0–SW7, which are also employed to switch the resistance of the variable resistor circuit 72 in the clock generator 70. Input to the terminals of the other input at the NAND circuits 620–627 is a switching signal BLS-ON, which is provided from the sequence controller 3 at the time for beginning the operation of the bit line controller 61. The switching signal BLS-ON is also given to a switching NMOS transistor 641. When the switching signal BLS-ON is made "H" and any one of the output signals SW0–SW7 is made "H", the output signal from one of the NAND circuits 620–627 is made "L" while remaining the others "H". These output signals are applied via the level shifters 610–617 to the gates of the PMOS transistors 600–607 to provide only one current path that contains one of the resistors 630–637. This is effective to change the gradient of the increasing curve of the bit line selection signal BLS.

Figure 8:
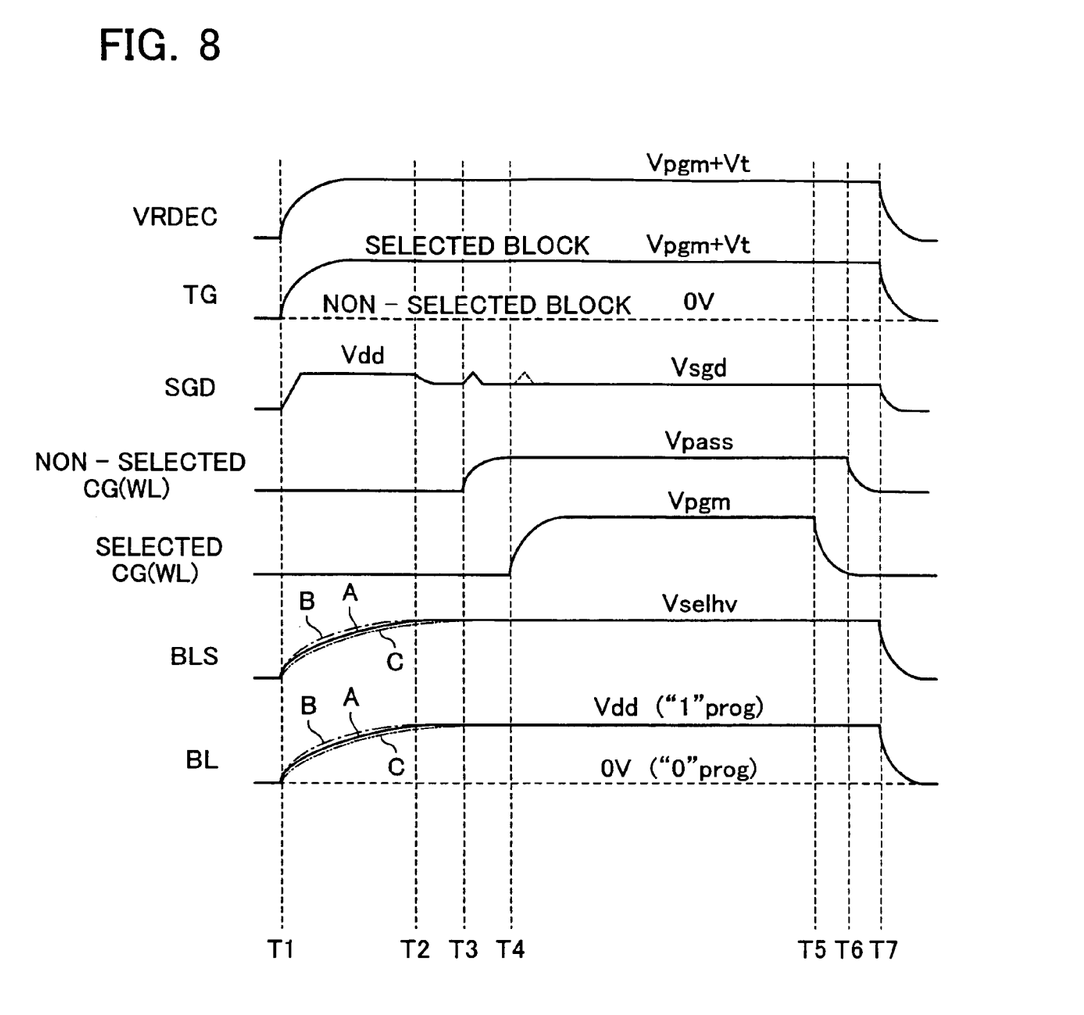
FIG. 8 is a timing chart showing operations in the NAND-type EEPROM according to the embodiment shown in FIG. 1.

The output signals SW0–SW7 from the clock period controller 5 are also given to the bit line controller 61 to reflect the result from trimming at the clock generator 70 to the bit line controller 61. For example, if the output signal from the clock period controller 5 is changed from SW3 to SW1 based on the measured result from the measurement unit 80, it is meant that the actual resistance of the resistors 720–727 varies to a value about 20% larger than the designed value. In this case, the resistors 630–637 having the same device structures in the bit line controller 61 also cause similar variations. Accordingly, the output signals SW0–SW7 from the clock period controller 5 are also given to the bit line controller 61 to switch the resistance. If this switching is not performed, the bit line selection signal BLS and the bit line voltage BL may rise more speedy (as the curve B in FIG. 16) or more slowly (as the curve C in FIG. 16) and greatly change the bit line charging waveform. In the present embodiment, even if process variations in resistance may arise, the bit line charging waveforms at that time (B, C) can be corrected so as to approximate a desired bit line charging waveform A (see FIG. 8).

The present embodiment is effective not only in bit line charging on programming but also in reading.

Figure 9:
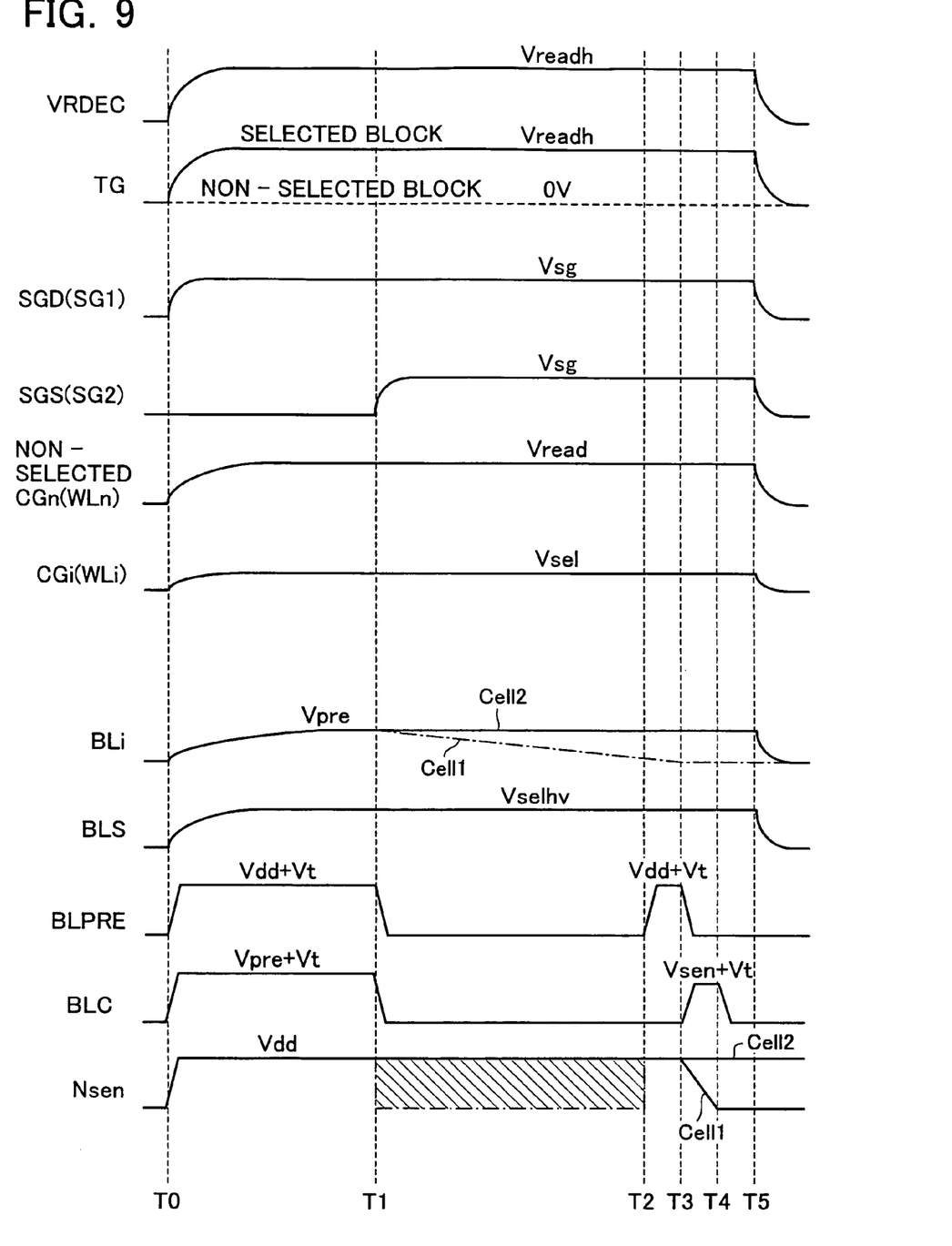
FIG. 9 shows waveforms on reading at various portions in the NAND cell-type EEPROM of FIG. 1.
Figure 10:
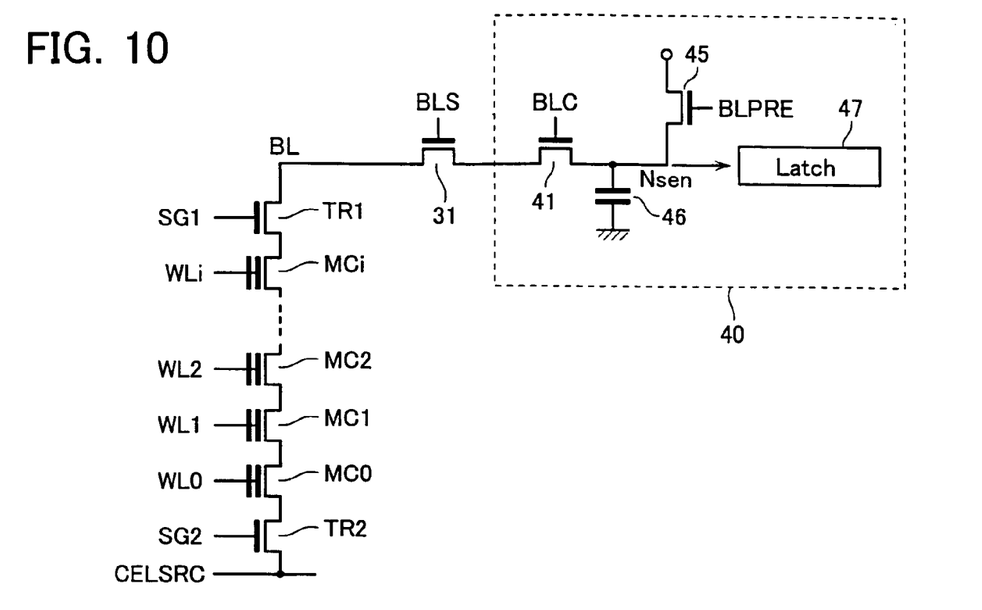
FIG. 10 shows a connection from a part of a sense amp to a memory cell involved in reading in the NAND cell-type EEPROM of FIG. 1.

FIG. 9 shows waveforms on reading in the NAND cell-type EEPROM. FIG. 10 shows a connection from a part of a sense amp to a memory cell involved in reading.

From timing T0 to T1, a reading selection word line voltage, Vsel (for example, 0 [V]), is applied to a selected control gate line CGi (word line WLi), and a reading pass voltage, Vread, is applied to non-selected control gate lines CGn (word lines WLn). A transfer voltage, Vreadh, is applied to the VRDEC driver 21 to allow the transfer transistor 21 in the row decoder 10 to transfer Vread. A sufficient voltage Vsg is applied to the selection gate line SGD (SG1) to turn on the selection transistor TR1.

At the same time, a voltage, Vpre+Vt (where Vt is the threshold of the clamping transistor 41), is applied to the gate BLC of the clamping transistor 41 in the sense amp and data latch 40 to pre-charge the bit line level to Vpre. A voltage, Vdd+Vt, is applied to the gate BLPRE to turn on a NMOS transistor 45 (FIG. 10) serving as a current source for pre-charge. As a result, the bit line selection signal BLS is boosted up to Vselhv as is in writing.

At timing T1 (FIG. 9), a sufficient voltage Vsg is applied to the selection gate line SGS to turn on the selection transistor TR2, which enables the selected memory cell to perform bit line discharging. If the selected memory cell, for example, MCi is in the state of "1" as shown in FIG. 15, the bit line discharging occurs and the bit line voltage BLi exhibits a waveform Cell 1 as shown in FIG. 9. On the other hand, if it is in the state of "0", no bit line discharging occurs and the pre-charged level is retained as a waveform Cell 2.

If the voltage, Vdd+Vt, is applied to the gate BLPRE of the NOMS transistor 45 during timing T2–T3, a node Nsen in the sense amp and data latch 40 is recharged to Vdd, prior to bit line sensing. A capacitor 46 is connected to stabilize the potential on the node Nsen.

A bit line sensing voltage, Vsen+Vt, is applied to the gate BLC of the clamping transistor 41 during timing T3–T4.

In the presence of a relation, Vsen<Vpre, a difference, Vpre−Vsen, is defined as a bit line amplitude to discriminate between a "1" cell and a "0" cell. If bit line discharging occurs (as the curve Cell 1 of BLi), the charge on the node Nsen is discharged to the bit line to lower the potential on the node Nsen. If no bit line discharging occurs (as the curve Cell 2 of BLi), the potential on the node Nsen is retained at the pre-charged Vdd because the clamping transistor 41 is not turned on.

At timing T4, the potential on the node Nsen is taken into the latch circuit 47 to determine data and, at timing T5, every signal is controlled to fall to finish reading.

During the reading, the charged voltage BLi on the bit line is lower compared to the writing. Therefore, it is easier than the writing to suppress the peak current on bit line charging. If the resistors 630–637 in the bit line controller 61 vary toward increased values, however, bit line discharging may begin while remaining the pre-charge voltage Vpre on the bit line insufficient. In this case, the bit line amplitude (Vpre–vset) may be lowered below the designed value to cause erroneous reading possibly. Accordingly, so as to achieve a desired bit line charging waveform despite the variations of the resistors from the designed values, it is preferable to appropriately correct the curve of the bit line charging voltage BLi with application of the bit line controller of FIG. 7 also in reading.

In the above example, the trimming data in the clock generator 70 is employed to adjust the resistance of the bit line controller 61. Trimming data in other circuits may also be employed to adjust the resistance of the bit line controller. The trimming data in the clock generator 70 in FIG. 2 actually reflects variations in capacitor and circuit delay. The use of trimming data in other circuits to adjust variations only in resistance allows a variation in resistance of the bit line controller 61 to be corrected more accurately.

As described above, when trimming data employed to adjust variations of resistors in another circuit is fed back to the bit line controller 61 including resistors, stable writing and reading can be achieved.

Figure 11:
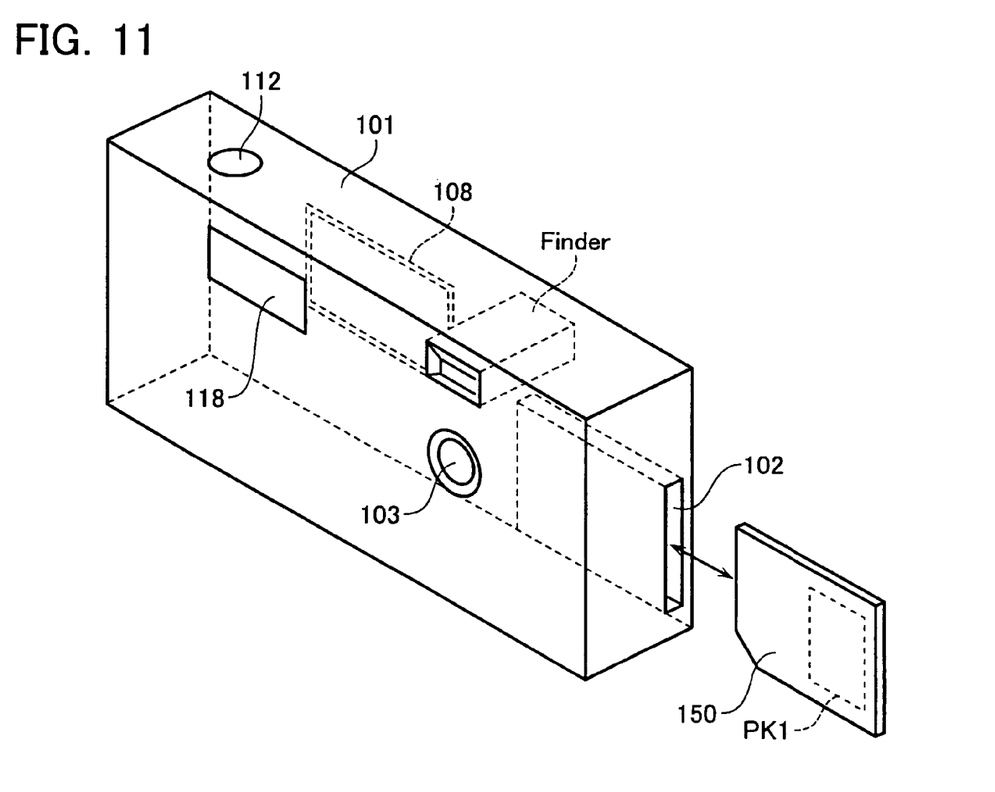
FIG. 11 shows a configuration including an electronic card that has the NAND cell-type EEPROM according to the above embodiment mounted thereon, and an electronic device that employs the electronic card.

An electronic card using the NAND cell-type EEPROM according to the above embodiment mounted thereon and an electronic device using the card will be described next on one embodiment. FIG. 11 shows a configuration of the electronic card according to this embodiment and the electronic device using the card. The electronic device is a digital still camera 101 as an example of the portable electronic device. The electronic card is a memory card 150 for use as a recording medium in the digital still camera 101. The memory card 150 includes an IC package PK1 that contains the NAND cell-type EEPROM described in the above embodiment integrated and sealed therein.

The case of the digital still camera 101 houses a card slot 102 and a circuit board, not shown, connected to the card slot 102. The memory card 150 is detachably attached into the card slot 102. When attached into the slot 102, the memory card 150 is electrically connected to electric circuits on the circuit board.

If the electronic card is a non-contact type IC card, it is electrically connected to the electric circuits on the circuit board by radio signals when it is housed in or approached to the card slot 102.

Figure 12:
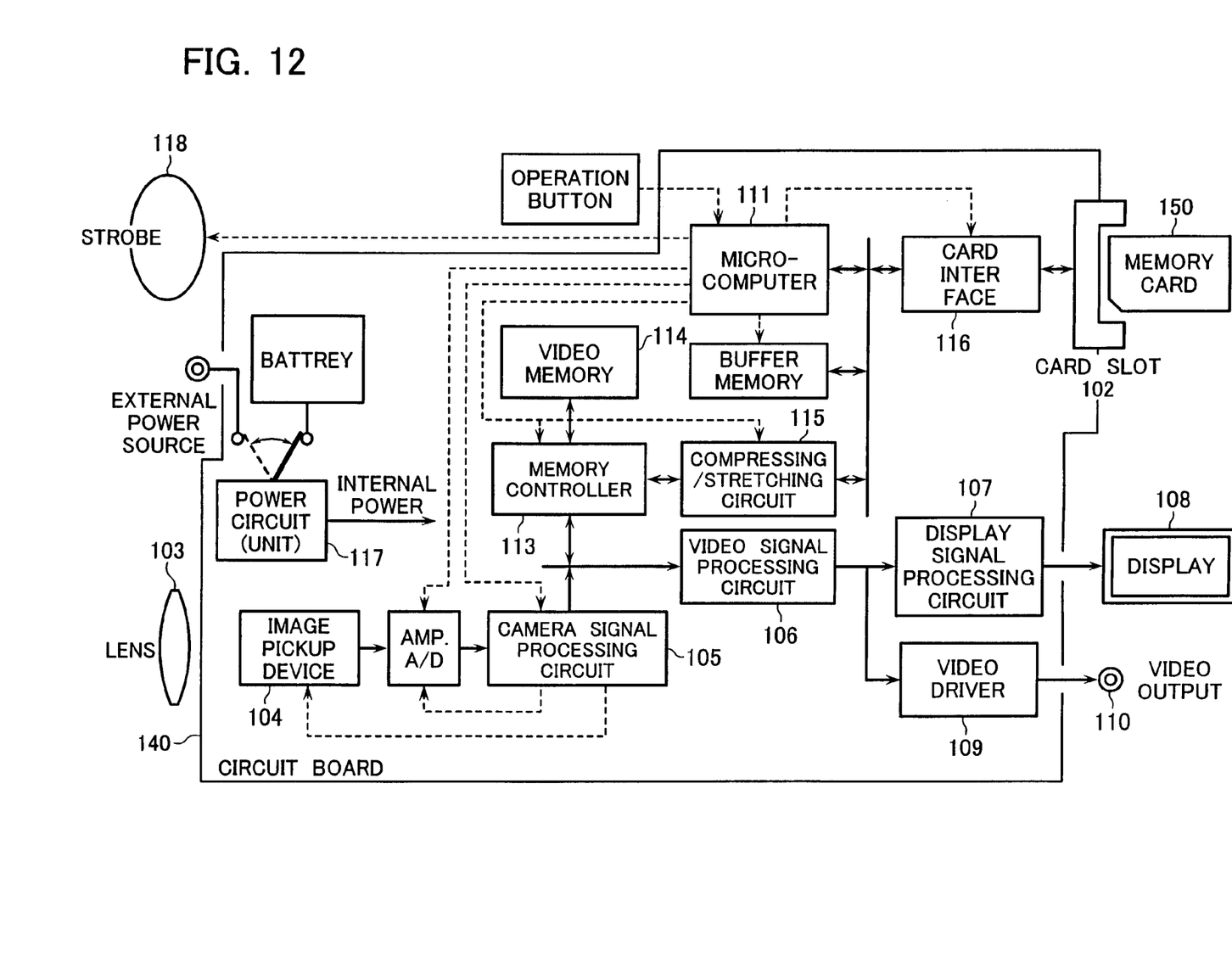
FIG. 12 shows a basic configuration of a digital still camera.
Figure 13A:
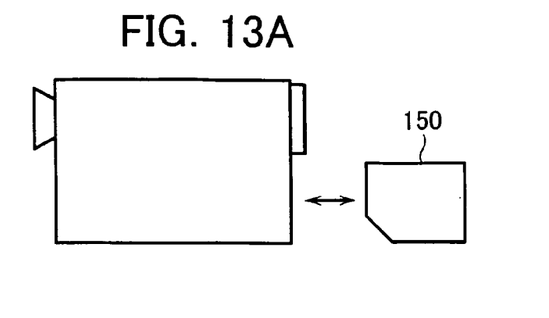
FIG. 13 shows various electronic devices to which the electronic card of FIG. 11 is applied.
Figure 13B:
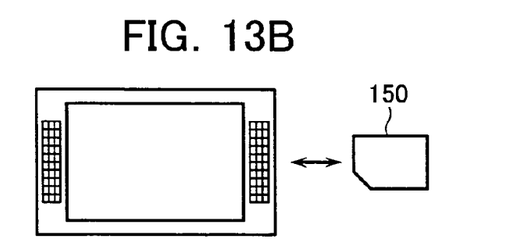
Figure 13C:
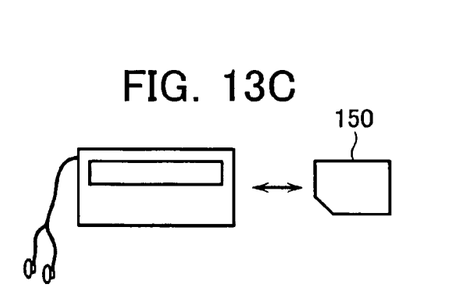
Figure 13D:
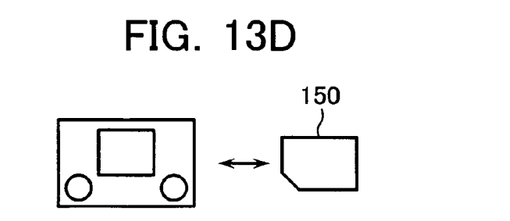
Figure 13E:
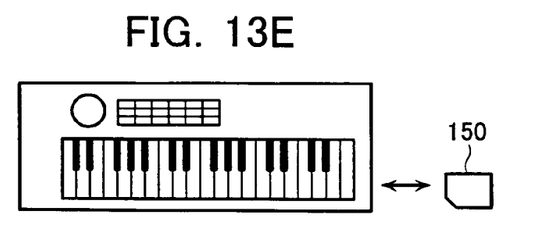
Figure 13F:
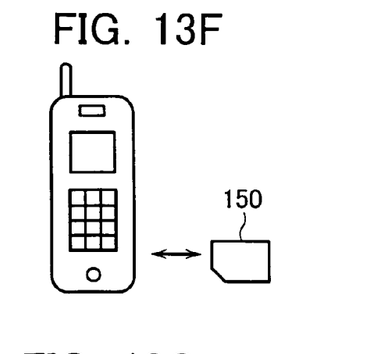
Figure 13G:
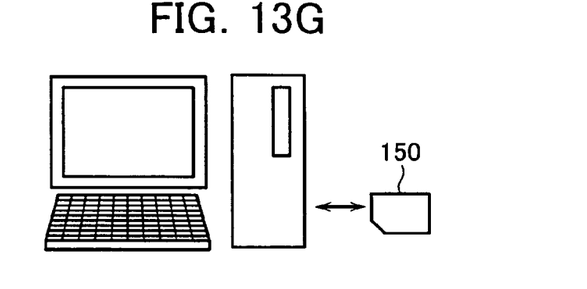
Figure 13H:
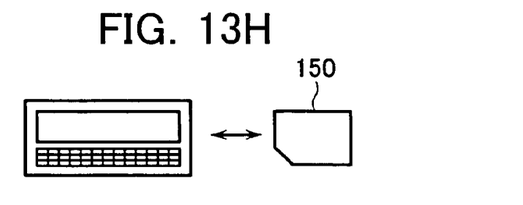
Figure 13I:
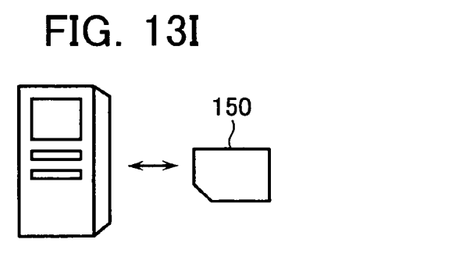
Figure 13J:
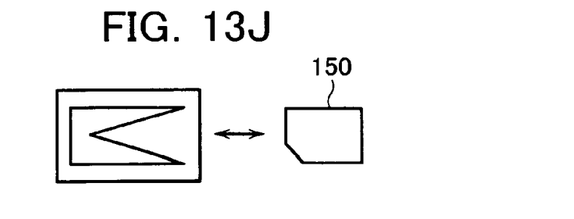

FIG. 12 shows a basic arrangement of the digital still camera. Light from an object is converged through a lens 103 and input to an imaging device 104. The imaging device 104 is, for example, a CMOS image sensor, which photo-electrically converts the input light into, for example, an analog signal output. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB) and color separation, and converted into a luminance signal and color difference signals.

To monitor an image, the signal output from the camera signal processing circuit 105 is input to a video signal processing circuit 106 and converted into a video signal. The video signal is, for example, of NTSC (National Television System Committee) type. The video signal is supplied via a display signal processing circuit 107 to a display unit 108 attached to the digital still camera 110. The display unit 108 comprises, for example, a liquid crystal monitor.

The video signal is supplied via a video driver 109 to a video output terminal 110. An image captured by the digital still camera 101 can be output to an image display device such as a television via the video output terminal 110. This allows the captured image to be displayed on the image display device other than the display unit 108. A microcomputer 111 is employed to control the imaging device 104, the analog amplifier (AMP), the A/D converter (A/D), and the camera signal processing circuit 105.

To capture an image, an operator presses an operation button such as a shutter button 112. In response to this operation, the microcomputer 111 controls a memory controller 113 to write the output signal from the camera signal processing circuit 105 as a frame image into a video memory 114. The frame image written in the video memory 114 is compressed on the basis of a predetermined compression format by a compressing/stretching circuit 115. The compressed image is recorded, via a card interface 116, on the memory card 150 attached into the card slot.

To reproduce the recorded image, the image recorded on the memory card 150 is read out via the card interface 116, then stretched by the compressing/stretching circuit 115, and written into the video memory 114. The written image is input to the video signal processing circuit 106 and displayed on the display unit 108 or another image display device in the same manner as the image is monitored.

In this arrangement, the card slot 102, the imaging device 104, the analog amplifier (AMP), the A/D converter (A/D), the camera signal processing circuit 105, the video signal processing circuit 106, the memory controller 113, the video memory 114, the compressing/stretching circuit 115, and the card interface 116 are mounted on a circuit board 140.

It is not required to mount the card slot 102 on the circuit board 140. Rather, the card slot 102 may be coupled to the circuit board 140 via a connector cable or the like.

A power circuit 117 is also mounted on the circuit board 140. The power circuit 117 receives power from an external power source or a battery and generates an internal supply voltage for use in the digital still camera. A DC-DC converter may be used as the power circuit 117. The internal supply voltage is applied to the various circuits described above as well as a strobe 118 and the display unit 108.

As described above, the electronic card according to this embodiment can be used in portable electronic devices such as the digital still camera. The electronic card can be used in not only the portable electronic devices but also various other electronic devices as shown in FIGS. 13A to 13J. That is, the electronic card can be used in a video camera shown in FIG. 13A, a television shown in FIG. 13B, an audio instrument shown in FIG. 13C, a game machine shown in FIG. 13D, an electronic musical instrument shown in FIG. 13E, a cellular phone shown in FIG. 13F, a personal computer shown in FIG. 13G, a personal digital assistant (PDA) shown in FIG. 13H, a voice recorder shown in FIG. 13I, and a PC card shown in FIG. 13J.

The present invention has been described on the embodiments though it is not limited to these embodiments. Rather, various modifications, additions and replacements can be devised without departing from the scope and sprit of the invention. For example, in one embodiment, data on settings of the period of the clock signal CLK is written in certain memory cells in the memory cell array, and the data is transferred to and stored in a register (not shown) in the clock period controller 5.

In the above embodiment, the number of options to select the resistance in the bit line controller 61 is determined equal to that in the clock generator 70 though the former may be determined smaller than the latter. For example, if the clock generator 70 has eight options to select the resistance with an increment of 10% between two options, the bit line controller 61 may have about four options to select the resistance with an increment of about 20% between two options. This is effective to prevent the bit line controller 61 from having an enlarged circuit scale while suffering a lowered adjustment accuracy on the increasing curve of the bit line selection signal BLS in the bit line controller 61.

In the above embodiment, not only the resistance of the bit line controller 61 but also the resistance of the resistor in the row signal driver 20 including CG decoders may be switched in accordance with the switching of the resistance of the clock generator 70. This is effective to appropriately correct the increasing curves of the programming voltage Vpgm and the intermediate voltage Vpass applied to the word lines WLi. The sharper the increasing curves of the programming voltage Vpgm and the intermediate voltage Vpass, the larger the noise on the selection gate line SGD arises, resulting in worsened erroneous programming. In contrast, the smaller the gradient of the increasing curve, the slower the word line WLi rises, resulting in possible slower programming. In such the case, the rising waveform can be appropriately corrected by adjusting the resistance inserted in the row signal driver 20 including CG decoders, which apply the programming voltage Vpgm and the intermediate voltage Vpass, or the circuits or paths connected to other word lines WLi.

What is claimed is:

1. A semiconductor memory device, comprising:
   a memory cell array including a plurality of data-storing memory cells arranged in matrix at intersections of word lines and bit lines;
   a decoder operative to select a memory cell in said memory cell array;
   a driver configured to charge said word line or bit line and including a first resistor, said first resistor having a resistance variable to change a rate of charging said word line or bit line;
   a voltage generator operative to generate a voltage supplied to said driver;
   a sequence controller operative to control operations of said voltage generator and said driver in accordance with a procedure instructed by a command and along an operation timing indicated by a control signal;
   a control signal generator configured to generate said control signal and including a second resistor, said second resistor having a resistance variable to change the state of said control signal;
   a storage unit operative to store adjustment data for setting a resistance of said second resistor at a designed resistance; and
   a control unit operative to refer to said storage unit for stored data and switch said second resistor to control the state of said control signal, and operative to switch said first resistor to a resistance corresponding to said resistance of said second resistor.

2. The semiconductor memory device according to claim 1, further comprising a decision unit operative to decide the state of said control signal actually obtained when said resistance of said second resistor is set to a certain designed value,
   wherein said storage unit stores adjustment data for setting a resistance of said second resistor at a designed resistance, said adjustment data being specified based on the decided result from said decision unit.

3. The semiconductor memory device according to claim 2, wherein said control signal generator comprises a clock generator operative to generate a clock signal, and wherein said decision unit decides a period of said clock signal as the state of said control signal.

4. The semiconductor memory device according to claim 1, wherein said control signal generator comprises a clock generator operative to generate a clock signal, and
   wherein an operation whose operation time is proportional to said period of said clock signal is performed, and said storage unit stores said adjustment data based on information obtained from measurement of said operation time.

5. The semiconductor memory device according to claim 3, wherein a reference signal having an integer-multiplied period compared to a desired period of said clock signal is generated in synchronization with said clock signal, and
   wherein said decision unit decides said period of said clock signal based on a logic level of said reference signal when said clock signal is generated only during said integer-multiplied period.

6. The semiconductor memory device according to claim 1, wherein said first resistor has the same structure as that of said second resistor.

7. The semiconductor memory device according to claim 1, said control signal generator including:
   a resistor train of a plurality of serially connected resistors designed to have certain resistances; and
   a plurality of switching elements each connected between one of connection nodes on said resistor train and a supply voltage, either one of said switching elements being turned on and the other being turned off by a switching signal.

8. The semiconductor memory device according to claim 3, said clock generator including:
   a resistor train of a plurality of serially connected resistors produced to have certain resistances;
   a plurality of switching elements each connected between one of connection nodes on said resistor train and a supply voltage, either one of said switching elements being turned on and the other being turned off by a switching signal;
   an output circuit operative to provide two pulse signals having opposite logic levels depending on variations in input signals;
   two charging/discharging circuits having capacitors and configured to release charges from said capacitors on receipt of variations in logic level of said pulse signals; and
   two comparators operative to compare voltages across both ends of said capacitors with a reference voltage to provide compared signals,
   wherein said output circuit provides said pulse signals using said compared signals as said input signals.

9. The semiconductor memory device according to claim 8, wherein said output circuit includes a flip-flop circuit.

10. The semiconductor memory device according to claim 8, wherein said charging/discharging circuit is switched between a charging state and a discharging state by said pulse signal output from said output circuit.

11. The semiconductor memory device according to claim 10, wherein said charging/discharging circuit includes a switching element serially connected to said capacitor, said switching element being switched between a conductive state and a non-conductive state by said pulse signal.

12. The semiconductor memory device according to claim 8, wherein said charging/discharging circuit is configured to vary a discharging rate thereof by the magnitude of current flowing in said resistor train.

13. The semiconductor memory device according to claim 8, further comprising a current mirror circuit operative to mirror said current in said resistor train,
wherein said charging/discharging circuit is configured to vary a discharging rate thereof by the magnitude of current mirrored by said current mirror circuit.

14. The semiconductor memory device according to claim 8, wherein said switching element is controlled for switching based on a signal output from said control unit.

15. The semiconductor memory device according to claim 1, wherein said storage unit comprises a non-volatile semiconductor memory device.

16. The semiconductor memory device according to claim 1, wherein said storage unit comprises a part of said memory cells contained in said memory cell array.

17. The semiconductor memory device according to claim 1, said driver including a plurality of current paths containing respective resistors having different resistances, wherein at least one of said plurality of current paths is made conductive in accordance with a switched state of said second resistor.

18. The semiconductor memory device according to claim 17, said plurality of current paths including respective switching elements, wherein at least one of said switching elements is turned on in accordance with a switched state of said second resistor.

19. An electronic card comprising a semiconductor memory device mounted thereon, said semiconductor memory device including:
a memory cell array including a plurality of data-storing memory cells arranged in matrix at intersections of word lines and bit lines;
a decoder operative to select a memory cell in said memory cell array;
a driver configured to charge said word line or bit line and including a first resistor, said first resistor having a resistance variable to change a rate of charging said word line or bit line;
a voltage generator operative to generate a voltage supplied to said driver;
a sequence controller operative to control operations of said voltage generator and said driver in accordance with a procedure instructed by a command and along an operation timing indicated by a control signal;
a control signal generator configured to generate said control signal and including a second resistor, said second resistor having a resistance variable to change the state of said control signal;
a storage unit operative to store adjustment data for setting a resistance of said second resistor at a designed resistance, said adjustment data being specified based on the state of said control signal actually obtained when said resistance of said second resistor is set to a certain designed value; and
a control unit operative to refer to said storage unit for stored data and switch said second resistor to control the state of said control signal, and operative to switch said first resistor to a resistance corresponding to said resistance of said second resistor.

20. The electronic card according to claim 19, further comprising a decision unit operative to decide the state of said control signal actually obtained when said resistance of said second resistor is set to a certain designed value,
wherein said storage unit stores a adjustment data for setting a resistance of said second resistor at a designed resistance, said adjustment data being specified based on the decided result from said decision unit.

* * * * *